(12) United States Patent
Higashino

(10) Patent No.: US 6,426,527 B1
(45) Date of Patent: Jul. 30, 2002

(54) SEMICONDUCTOR MEMORY AND METHOD FOR FABRICATING THE SAME

(75) Inventor: Tomohiko Higashino, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/676,781

(22) Filed: Oct. 2, 2000

(30) Foreign Application Priority Data

Oct. 1, 1999 (JP) .......................................... 11-282133

(51) Int. Cl.[7] ............................................ H01L 27/108
(52) U.S. Cl. ...................... 257/309; 257/534; 438/255; 438/398; 438/964
(58) Field of Search ................................ 257/309, 534; 438/255, 398, 964

(56) References Cited

U.S. PATENT DOCUMENTS

| | | | |
|---|---|---|---|
| 5,792,689 A | 8/1998 | Yang et al. | 438/253 |
| 5,795,805 A | 8/1998 | Wu et al. | 438/253 |
| 5,817,555 A | 10/1998 | Cho | 438/253 |
| 6,177,310 B1 * | 1/2001 | Lin et al. | 438/255 |
| 6,207,523 B1 * | 3/2001 | Parekh et al. | 438/396 |
| 6,258,691 B1 | 7/2001 | Kim | |
| 6,303,956 B1 * | 10/2001 | Sandhu et al. | 257/306 |

FOREIGN PATENT DOCUMENTS

| | | |
|---|---|---|
| GB | 2 334 621 | 8/1999 |
| GB | 2 337 159 | 11/1999 |
| JP | 2000-31424 A | 1/2000 |
| JP | 2000-36035 A | 2/2000 |
| JP | 2000-49304 A | 2/2000 |

* cited by examiner

*Primary Examiner*—Richard Elms
*Assistant Examiner*—Christian D. Wilson
(74) *Attorney, Agent, or Firm*—Foley & Lardner

(57) ABSTRACT

In a semiconductor memory having a number of stacked capacitor memory cells each having a cylindrical lower electrode which is in the form of a cylinder having an open top and a closed bottom, an upper end of a partition, which is formed of an insulating material between adjacent cylindrical lower electrodes, has an sharpened tip end and an inclined surface descending from the sharpened tip end toward each adjacent cylindrical lower electrode. With this arrangement, it is possible to prevent silicon grains of a hemi-spherical grain silicon from nidating on the partition, thereby prevent a short-circuiting between the adjacent cylindrical lower electrodes, without reducing the capacitance of the memory cell.

17 Claims, 7 Drawing Sheets

SEMICONDUCTOR MEMORY AND METHOD FOR FABRICATING THE SAME

BACKGROUND OF THE INVENTION

The present invention relates to a semiconductor memory and a method for fabricating the same, and more specifically to a structure of a semiconductor memory of a one-transistor memory cell type having a stacked capacitor.

Recently, in a semiconductor memory such as DRAM (dynamic random access memory), a demand for reducing a required memory cell area is becoming strong in order to elevate the integration density.

One means for meeting with this demand is to provide each memory cell with a capacitor having a large capacitance per an occupying area. For this purpose, it was proposed to form one of an upper electrode and a lower electrode of each capacitor, for example, the lower electrode of each capacitor, in the form of a cylinder, thereby increase the capacitance of the capacitance. Furthermore, it was proposed to form a number of hemi-spherical silicon grains (hemi-spherical grain silicon (HSG-Si)) on a surface of the cylindrical electrode to increase a surface area of the electrode, thereby to further increase the capacitance of the capacitance.

Here, a prior art structure of the semiconductor memory having the hemi-spherical grain silicon structure will be explained with reference to FIG. 7, which is a diagrammatic sectional view of the prior art semiconductor memory having the hemi-spherical grain silicon structure.

As shown in FIG. 7, the prior art semiconductor memory includes a P-type silicon substrate 3 and a gate oxide film (not shown), a gate electrode 22 and an N-type diffused layer 4 formed at a principal surface of the silicon substrate 3. An interlayer insulating film 24 is formed to cover the silicon substrate 3 and the gate electrode 22, and a silicon oxide film 12 is formed thereon.

The prior art semiconductor memory includes a through hole penetrating through the interlayer insulating film 24 and the silicon oxide film 12 to reach the N-type diffused layer 4, and a phosphorus-doped polysilicon film is deposited by a CVD (chemical vapor deposition) process to fill the through hole, thereby to form a capacitor contact plug 21.

On an upper end surface of the capacitor contact plug 21, a lower electrode 31 in the form of an open-top, closed-bottom cylinder and formed of a doped polysilicon, is formed to have a predetermined thickness, and hemi-spherical silicon grains (HSG-Si) 31A are formed on an inner surface of the cylindrical lower electrode 31.

Between each two adjacent cylindrical lower electrode 31 formed in the semiconductor memory, a partition 11 is formed of an oxide film. For example, the partition 11 is formed of a stacked layer of a silicon oxide film 23, a BPSG (borophosphosilicate glass) film 13 and an NSG (non-doped silicate glass) film 14.

Now, a method for forming the HSG-Si polysilicon capacitor electrode will be explained also with reference to FIG. 7.

As shown in FIG. 7, first, a silicon oxide film (field oxide) 3A is formed on a principal surface of the P-type silicon substrate 3 by means of a LOCOS (local oxidation of silicon) process, and a gate oxide film (not shown) is formed on a device formation region confined by the silicon oxide film 3A. Succeedingly, a gate electrode, a source region and a drain region are formed at the principal surface of the silicon substrate 3. The interlayer insulating film 24 formed of the BPSG film and the silicon oxide film 12 are deposited on the whole surface of the substrate.

Thereafter, a through hole is formed to penetrate through the silicon oxide film 12 and the interlayer insulating film 24 to reach the N-type diffused layer 4, and a phosphorus-doped polysilicon film is deposited to fill the through hole, thereby to form a capacitor contact plug 21 in contact with the N-type diffused layer 4. Then, a silicon oxide film 23, an insulating film 13 formed of a BPSG film and a silicon oxide film 14 formed of an NSG film are formed on the whole surface of the substrate in the named order. Succeedingly, a patterned resist is formed on the whole surface of the substrate by a photolithography, and the stacked insulating layer formed of the silicon oxide film 14, the insulating film 13 and the silicon oxide film 23, is etched to form a hole for formation of the lower electrode.

A doped polysilicon film is deposited on the whole exposed surface of the hole formed in the stacked insulating layer, to form the cylindrical lower electrode 31.

Thereafter, hemi-spherical silicon grains (HSG-Si) 31A are formed and grown on an inner surface of the cylindrical lower electrode 31 by the CVD process.

Here, in order to prevent a short-circuiting between adjacent lower electrodes 31, the hemi-spherical silicon grains (HSG-Si) 31A formed on the upper portion of the lower electrode 31 are removed. For this purpose, specifically, an acid washing and an etching are carried out for the hemi-spherical silicon grains (HSG-Si) 31A and the NSG film 14 forming an upper portion of the partition 11. The degree of the acid washing carried out at this time is controlled to the effect that the NSG film 14 is slightly projected, and the etching is an overetching On the lower electrode 31 formed as mentioned above, a dielectric film formed of an insulating film and an upper electrode (both not shown) are formed in the named order. Thus, the semiconductor memory is fabricated.

However, the following problems were encountered in the prior art semiconductor memory having the hemi-spherical grain silicon structure:

First, the hemi-spherical silicon grains (HSG-Si) 31A are flaked off from the surface of the lower electrode in the acid washing carried out later, and the flaked-off hemi-spherical silicon grains nidate on an upper portion of the partition, with the result that a short-circuiting occurs between adjacent lower electrodes, namely, between adjacent memory cells.

If this short-circuiting occurs, the semiconductor memory so configured to store one bit of information per one memory cell, becomes defective. If the lower electrodes of the memory cells of two bits are short-circuited, unless the same data is stored in the memory cells of two bits, an electric charge store in one memory cell flows to the other memory cell, with the result that a potential of the one memory cell drops, and therefore, a reading error occurs at the time of a data reading.

Secondly, in the prior art, the doped polysilicon was etched back by an overetching in order to prevent the short-circuiting between adjacent memory cells. As a result, the hemi-spherical silicon grains (HSG-Si) 31A are flaked off from an inner surface of the cylindrical lower electrode, so that there are produced a large number of semiconductor memories that do not have a desired memory cell capacitance as a product. Namely, a yield of production drops.

BRIEF SUMMARY OF THE INVENTION

Accordingly, it is an object of the present invention to provide a semiconductor memory and a method for fabricating the same, which have overcome the above mentioned problems of the prior art.

Another object of the present invention is to provide a semiconductor memory and a method for fabricating the same, capable of preventing a short-circuiting between the adjacent cylindrical lower electrodes. without reducing the capacitance of the memory cell.

The above and other objects of the present invention are achieved in accordance with the present invention by a semiconductor memory having a number of stacked capacitor memory cells each having a cylindrical lower electrode which is in the form of a cylinder having an open top and a closed bottom and which is formed of a doped polysilicon having a predetermined thickness, the cylindrical lower electrode having a hemi-spherical grain silicon formed on an inner surface of the cylindrical lower electrodes, wherein an upper end of a partition, which is formed of an insulating material between adjacent cylindrical lower electrodes, has a shape preventing a nidation of a silicon grain of the hemi-spherical grain silicon.

With the above mentioned arrangement, even if a hemi-spherical silicon grain is flaked off from the surface of the lower electrode in the acid washing carried out later, it is possible to prevent the flaked-off hemi-spherical silicon grains from nidating on an upper portion of the partition, thereby to prevent a short-circuiting from occurring between adjacent lower electrodes, namely, between adjacent memory cells, by means of the flaked-off hemi-spherical silicon grain.

Here, the shape preventing a nidation of a silicon grain of the hemi-spherical grain silicon, means a shape of preventing the flaked-off hemi-spherical silicon grain from nidating on at least the upper end of the partition, when the hemi-spherical silicon grain is flaked off from the surface of the lower electrode by a physical force acting in the acid washing carried out later.

In other words, the shape preventing a nidation of a silicon grain of the hemi-spherical grain silicon, means a shape of ensuring that the flaked-off hemi-spherical silicon grain is never positioned on the upper end of the partition between adjacent lower electrodes, in order to prevent an electrical connection between the hemi-spherical silicon grains formed on only the lower electrodes, in particular, on the upper end of the lower electrodes.

For example, an average size of a single grain in the hemi-spherical silicon grains formed on the lower electrodes, is measured, and the size of a horizontal surface area in the upper end of the lower electrodes is set on the basis of the measure average size of the hemi-spherical silicon grains in order to ensure that the flaked-off hemi-spherical silicon grain never nidates on the upper end of the partition.

Here, the single grain means one nucleus (or grain) in a number of nucleuses included in the hemi-spherical grain silicon formed on the lower electrode. Specifically, the single grain means each one hemi-spherical silicon grain which may be flaked off from the lower electrode in the acid washing step.

According to a second aspect of the present invention, the upper end of the partition has an inclined surface. With this arrangement, since the flaked-off hemi-spherical silicon grain nidates on the inclined surface formed in the upper end of the partition, it is possible to prevent the short-circuiting between the lower electrodes by action of the flaked-off hemi-spherical silicon grain.

According to a third aspect of the present invention, the upper end of the partition is convex. With this arrangement, since the flaked-off hemi-spherical silicon grain nidates on the inclined surface of the convex upper end of the partition, it is possible to prevent the short-circuiting between the lower electrodes by action of the flaked-off hemi-spherical silicon grain.

According to a fourth aspect of the present invention, the upper end of the partition has a projecting center portion. With this arrangement, since the flalked-off hemi-spherical silicon grain is hardly to nidate on the center portion of the partition and since the flaked-off hemi-spherical silicon grain nidates on a side surface of the projecting center portion of the partition, it is possible to prevent the short-circuiting between the lower electrodes by action of the flaked-off hemi-spherical silicon grain.

According to a fifth aspect of the present invention, the partition is so configured that the upper end of the partition constitutes an apex. With this arrangement, since the flaked-off hemi-spherical silicon grain is hardly to nidate around the apex end of the partition, and since the flaked-off hemi-spherical silicon grain is easy to nidate on a peripheral surface of the apex end of the partition, it is possible to prevent the short-circuiting between the lower electrodes by action of the flaked-off hemi-spherical silicon grain.

According to a sixth aspect of the present invention, the partition is continuously formed, and the continuously formed partition has a continuously formed upper end. With this arrangement, it is possible to prevent a short-circuiting between each pair of adjacent lower electrodes when a number of lower electrodes are formed adjacent to one another.

According to a seventh aspect of the present invention, the cylindrical lower electrode has an exposed outer wall surface. Since the cylindrical lower electrode has an exposed outer wall surface, the lower electrode has an increased total exposed surface area, so that the memory cell capacitor has an increased capacitance.

According to an eighth aspect of the present invention, a gutter is formed between the partition and the cylindrical lower electrode. Since the gutter is formed between the partition and the cylindrical lower electrode, the flaked-off hemi-spherical silicon grain having fallen into the gutter, never reaches the upper end of the partition, and therefore, it is possible to prevent the short-circuiting between the lower electrodes by action of the flaked-off hemi-spherical silicon grain.

According to a ninth aspect of the present invention, an outer wall surface of the cylindrical lower electrode is exposed in the gutter. With this arrangement, it is possible to prevent the short-circuiting between the lower electrodes by action of the flaked-off hemi-spherical silicon grain, and also, it is possible to increase the exposed surface area of the lower electrode, with the result that the capacitance of the memory cell capacitor is increased.

According to a tenth aspect of the present invention, the gutter has a width larger than the size of one silicon grain of the hemi-spherical grain silicon formed on the inner surface of the cylindrical lower electrode. Since the gutter has a width larger than the size of the hemi-spherical silicon grain, the gutter can sufficiently accommodate the flaked-off hemi-spherical silicon grain, so that it is possible to prevent the short-circuiting between the lower electrodes by action of the flaked-off hemi-spherical silicon grain.

According to an eleventh aspect of the present invention, the gutter has a depth not larger than a half of the depth of the partition. Since the gutter has the depth not larger than the half of the depth of the partition, it is possible to ensure the strength of the partition formed in a convex form, and at the same time, to increase the surface area of the lower electrode to a possible extent, namely, to increase the capacitance of the memory cell capacitor.

According to a twelfth aspect of the present invention, there is provided a method for forming a semiconductor memory having a number of stacked capacitor memory cells each having a cylindrical lower electrode in the form of a cylinder having an open top and a closed bottom, the method including the steps of depositing a stacked layer of an insulating layer and an oxide film on a semiconductor substrate, forming on the stacked layer a lower electrode in the form of a cylinder having an open top and a closed bottom and formed of a doped polysilicon, by means of a resist processing, forming a hemi-spherical grain silicon on an inner surface of the cylindrical lower electrode, forming an insulating film to form a partition filling up between adjacent cylindrical lower electrodes, and etching an oxide film in an upper end of the partition by an acid.

With this arrangement, opposite sides of the partition, namely, a region between the partition and the lower electrode, is etched quickly in comparison with a center portion of an upper end of the partition, so that the upper end of the partition becomes convex with a predetermined spacing being ensured between the partition and the lower electrode.

The reason for this is that: The lower electrode in contact with the partition is formed of the highly doped polysilicon, form example including a high concentration of phosphorus. Therefore, after the lower electrode is formed, the impurity such as the phosphorus included in the lower electrode is diffused into the partition.

Because the impurity was diffused into the partition from the lower electrode, a portion of the partition contacting with the lower electrode has an impurity concentration higher than that of the other portion of the partition. Therefore, after the hemi-spherical grain silicon is formed on the cylindrical lower electrode, if an etching is carried to the partition thus modified in nature, by using an acid, the portion of the partition contacting with the lower electrode is selectively etched because the portion of the partition contacting with the lower electrode has an etching rate higher than that of the other portion of the partition According to a thirteenth aspect of the present invention, the etching by the acid etches the oxide film in the upper end of the partition by an excessive acid.

By an overetching, a distance between the upper end of the lower electrode and an upper end of the partition becomes long, so that it is possible to reduce the percentage of occurrence of the short-circuiting between the lower electrodes. In addition, since the gutter is formed between the partition and the lower electrode, it become easy for the hemi-spherical grain silicon to fall in the gutter, and therefore, it is possible to further ensure the prevention of the short-circuiting between the lower electrodes.

The above and other objects, features and advantages of the present invention will be apparent from the following description of preferred embodiments of the invention with reference to the accompanying drawings.

DETAILED DESCRIPTION OF THE INVENTION

Embodiments of the semiconductor memory in accordance with the present invention will be described with reference to the drawings.

Figure 1:
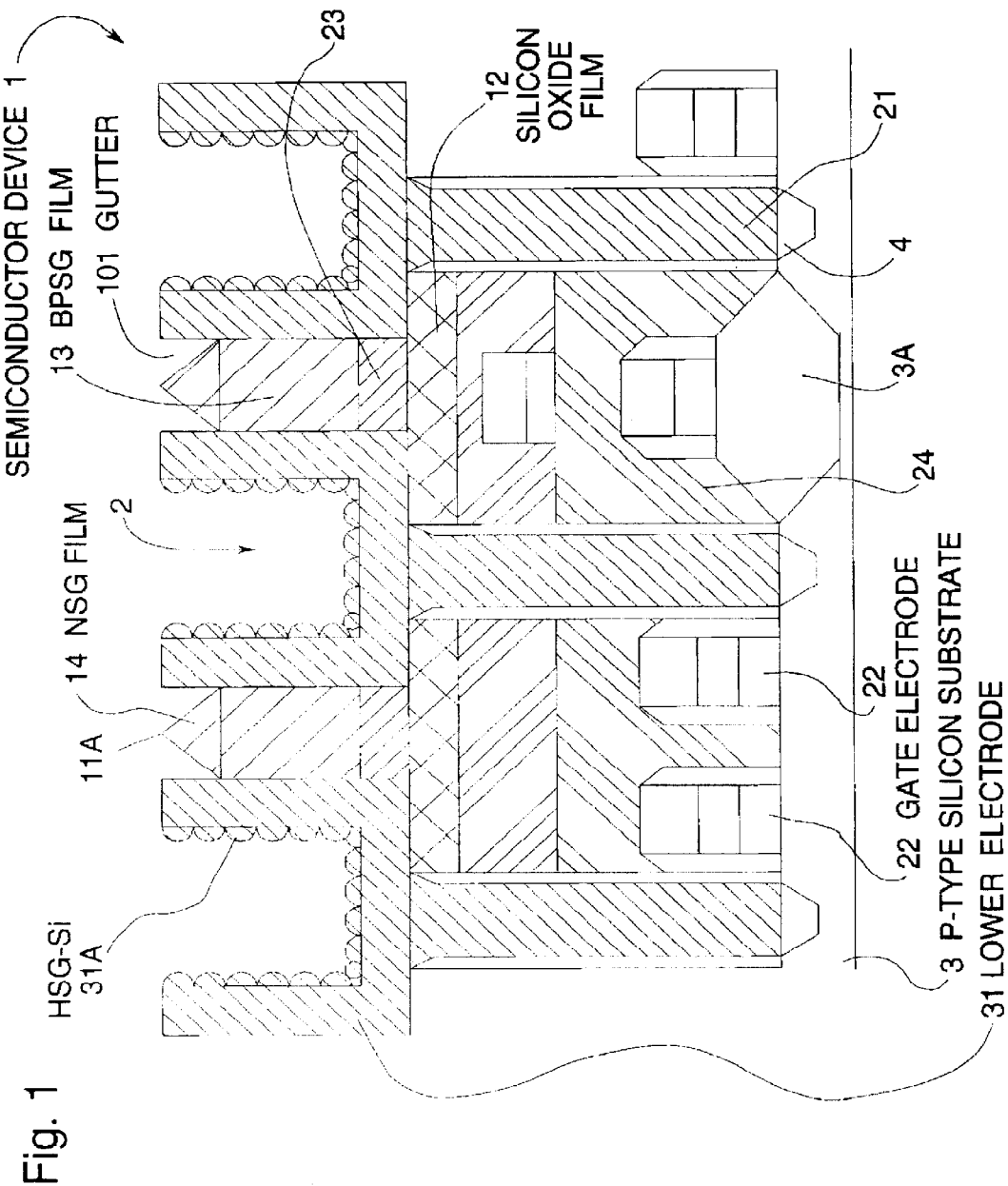
FIG. 1 is a diagrammatic sectional view of one embodiment of the semiconductor memory in accordance with the present invention.
Figure 7:
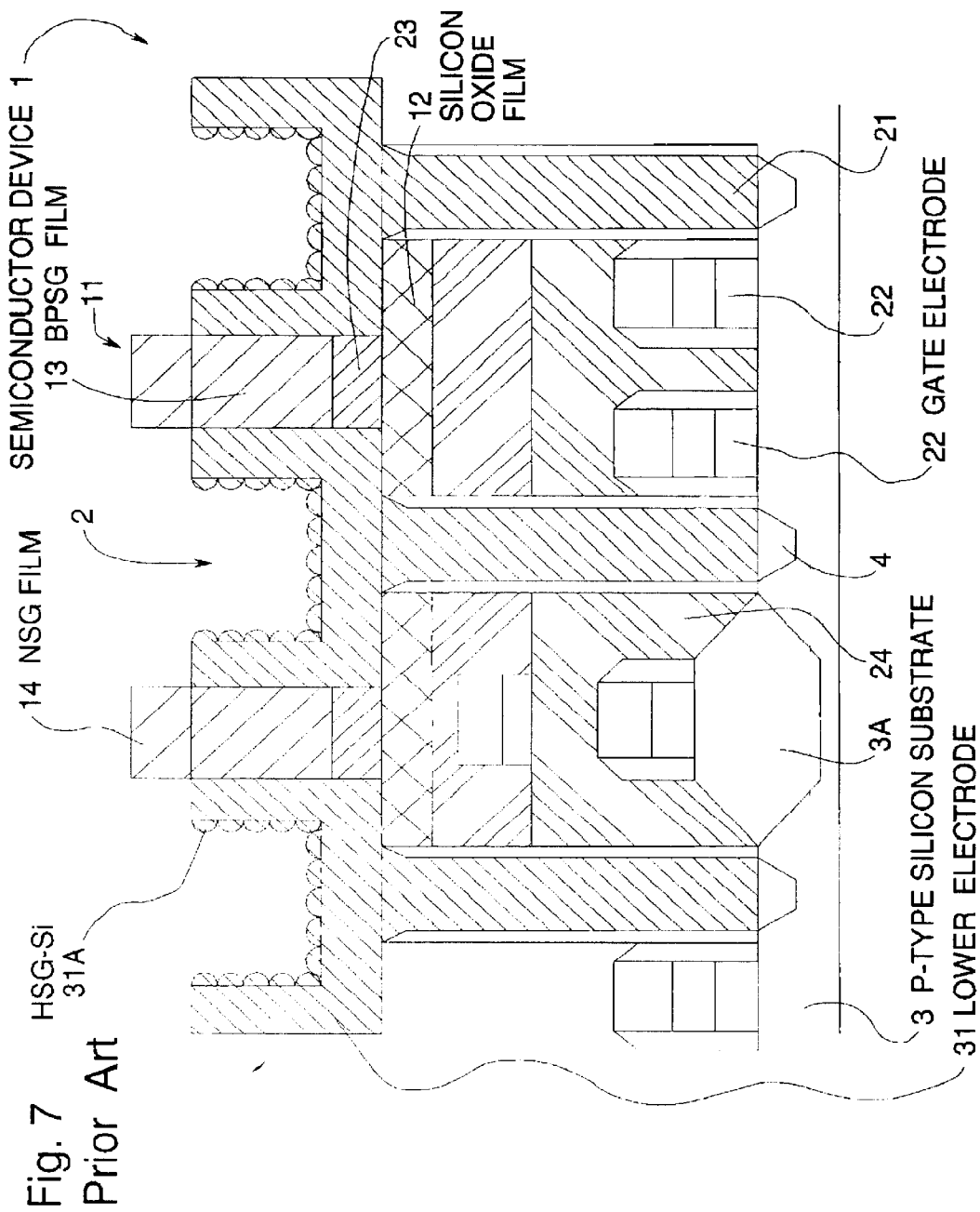
FIG. 7 is a diagrammatic sectional view of the prior art semiconductor memory.

Referring to FIG. 1, there is shown a diagrammatic sectional view of one embodiment of the semiconductor memory in accordance with the present invention. In FIG. 1, elements corresponding to those shown in FIG. 7 are given the same reference number.

As shown in FIG. 1, the semiconductor memory includes a P-type silicon substrate 3 and a gate oxide film (not shown), a gate electrode 22 and an N-type diffused layer 4 formed at a principal surface of the silicon substrate 3. An interlayer insulating film 24 is formed to cover the silicon substrate 3 and the gate electrode 22, and a silicon oxide film 12 is formed thereon.

A through hole is formed to penetrate through the interlayer insulating film 24 and the silicon oxide film 12 to reach the N-type diffused layer 4, and for example, a phosphorus-doped polysilicon film is deposited by a CVD process to fill the through hole, thereby to form a capacitor contact plug 21.

On an upper end surface of the capacitor contact plug 21, a lower electrode 31 in the form of an open-top, closed-bottom cylinder and formed of a doped polysilicon, is formed to have a predetermined thickness, and hemi-spherical silicon grains (HSG-Si) 31A are formed on an inner surface of the cylindrical lower electrode 31.

The hemi-spherical silicon grains 31A are substantially the same size, and are densely formed on the inner surface of the lower electrode 31.

Between each two adjacent cylinders 2, a partition 11 is formed of an oxide film. For example, the partition 11 is formed of a stacked layer of a silicon oxide film 23, a BPSG film 13 and an NSG film 14.

Here, an upper end 11A of the partition has such a shape that an upper end of the NSG oxide film 14 which is an uppermost film of the partition, forms an apex having an inclined surface descending downward from the apex toward each adjacent cylindrical lower electrode. Namely, a number of mountains are formed to surround each mouth formed at an upper end of a number of cylinders 2.

In addition, the upper end 11A of the partition 11 is preferred to have a sharpened tip end having a tip angle of less than 90 degrees. Furthermore, the inclined surface is preferred to be as close to a vertical surface as possible. Moreover, the upper end 11A of the partition 11 is preferably continuously formed since the partition 11 is continuously formed.

Namely, the upper end 11A is preferably formed in the form of a ridge surrounding each mouth formed at an upper end of a number of cylinders 2 In addition, it is preferred that an outer surface of the lower electrode 31, namely, a boundary surface between the lower electrode 31 and the partition 11, is exposed, so that between the inclined surface of the partition 11 and an outer wall surface of the lower electrode 31, there is formed a gutter 101 which can accommodate one flaked-off hemi-spherical silicon grains 31A. At this time, it is also preferred that the depth is not larger than a half of the depth of said partition.

Now, a method in accordance with the present invention for fabricating the semiconductor memory will be explained with reference to FIGS. 2 to 5, which are diagrammatic sectional views of the semiconductor memory for illustrating the method in accordance with the present invention for fabricating the semiconductor memory in accordance with the present invention.

Figure 2:
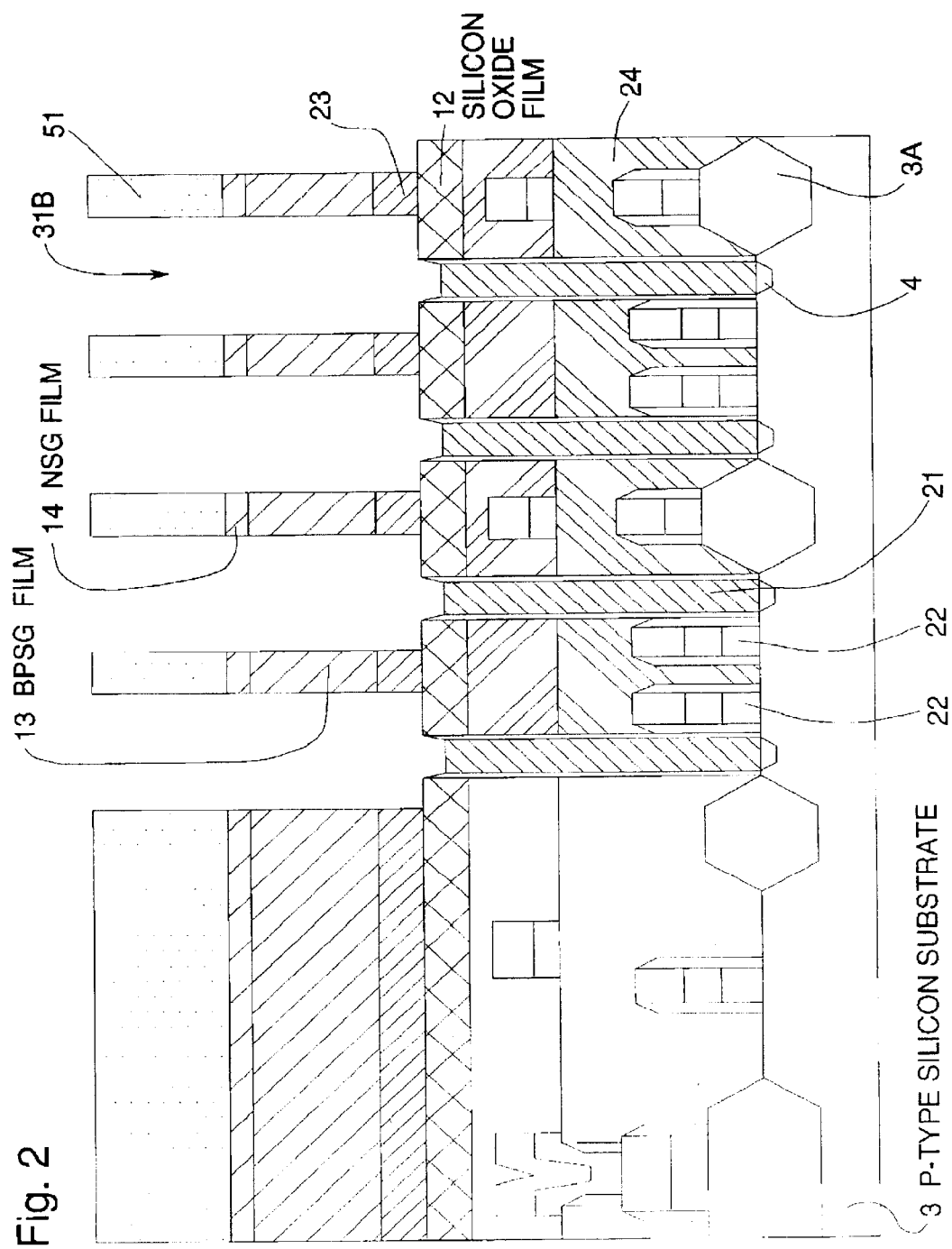
FIGS. 2 to 5 are diagrammatic sectional views of the semiconductor memory for illustrating the method in accordance with the present invention for fabricating the semiconductor memory in accordance with the present invention.

As shown in FIG. 2, first, a silicon oxide film (device isolation region) 3A is formed on a principal surface of the P-type silicon substrate 3, and a gate oxide film (not shown) is formed on a device formation region confined by the silicon oxide film 3A. Succeedingly, a gate electrode, a source region and a drain region are formed at the principal surface of the silicon substrate 3. The interlayer insulating film 24 formed of the BPSG film and the silicon oxide film 12 are deposited on the whole surface of the substrate.

Thereafter, a through hole is formed to penetrate through the interlayer insulating film 24 and the silicon oxide film 12 to reach the N-type diffused layer 4. A phosphorus-doped polysilicon film is deposited to fill the through hole, thereby to form a capacitor contact plug 21 in contact with the N-type diffused layer 4.

Then, a silicon oxide film 23, an insulating film 13 formed of a BPSG film and a silicon oxide film 14 formed of an NSG film are formed in the named order on the whole surface of the substrate thus formed. Succeedingly, a patterned resist 51 is formed on the whole surface of the substrate by a photolithography, and the stacked insulating layer formed of the silicon oxide film 14, the insulating film 13 and the silicon oxide film 23, is etched using the patterned resist 51 as a mask, to form a hole 31B for formation of the lower electrode 31 (FIG. 2).

Thereafter, the patterned resist 51 is removed, and a doped polysilicon film is deposited on the whole exposed surface of the hole 31B formed in the stacked insulating layer, to form the cylindrical lower electrode 31.

Figure 3:
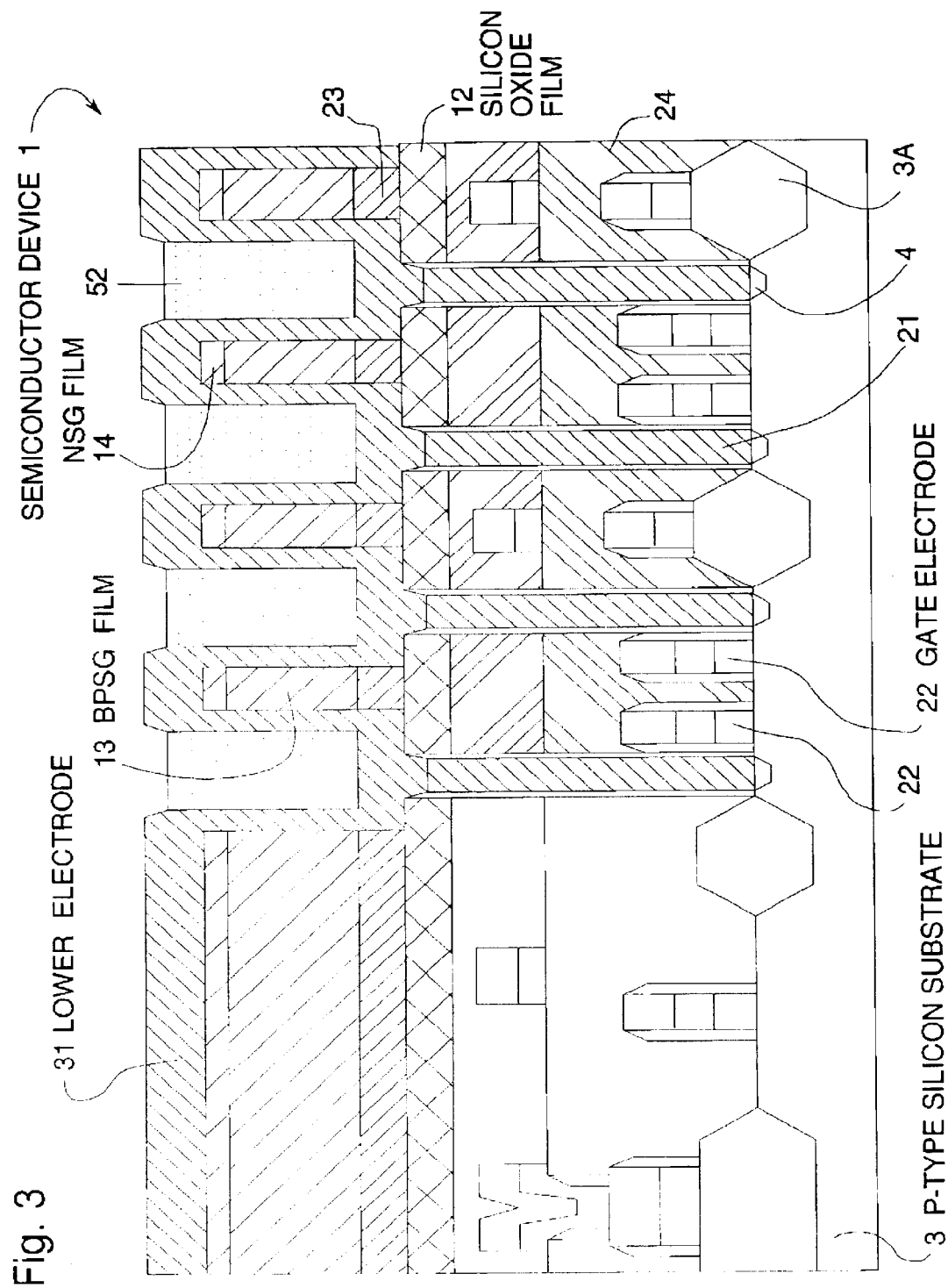
Figure 4:
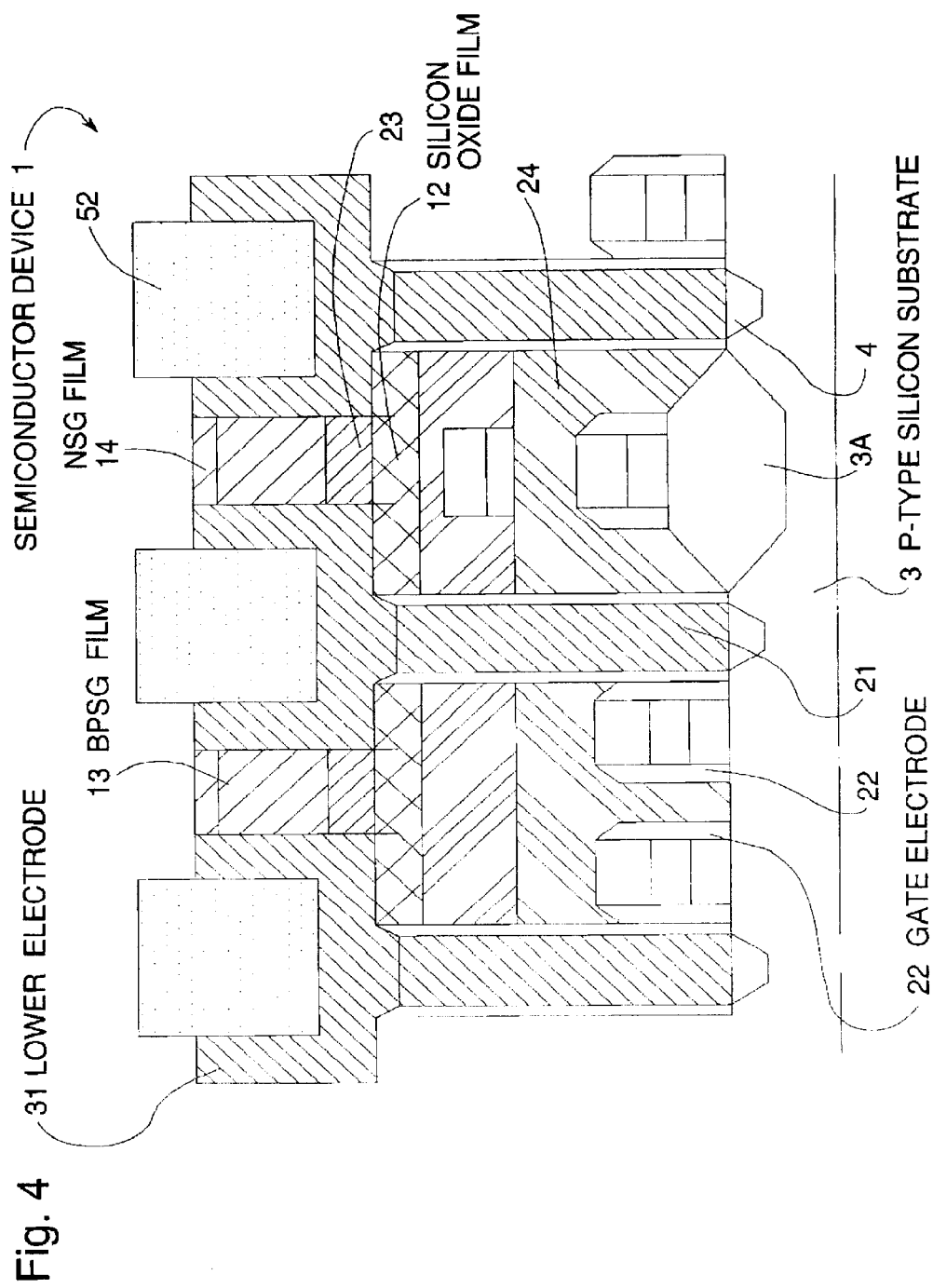

Then, as shown in FIG. 3, a resist 52 is filled within the cylinder 2, and the lower electrode 31 is patterned by an etching using a photolithography, so that the NSG film 14 remains. The sectorial view of the silicon substrate in this condition is shown in FIG. 4. As shown in FIG. 4, the resist 52 remaining within the cylinders 2 separated by the partition 11, projects from a top surface of the cylinders 2.

Figure 5:
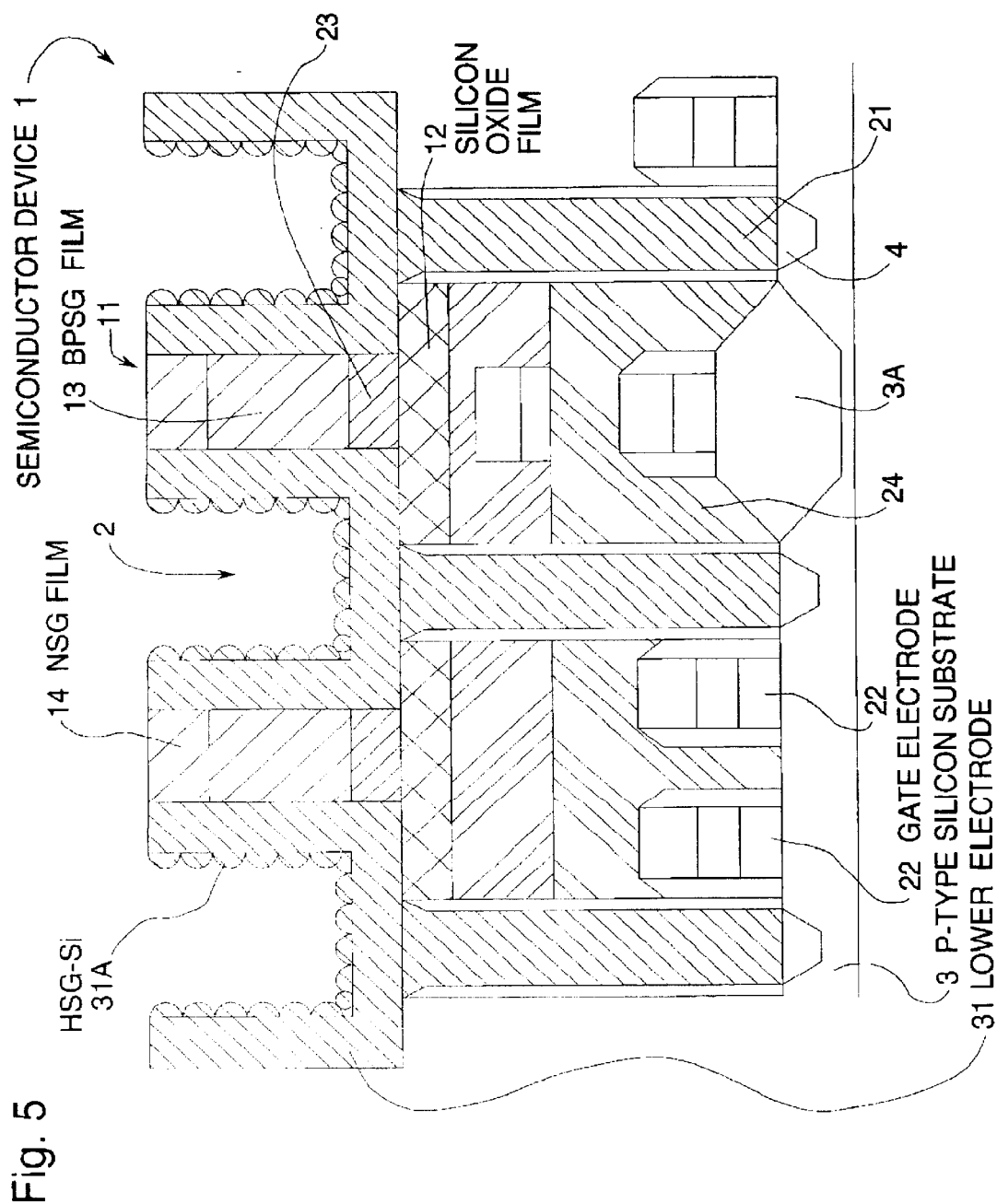

Thereafter, the resist 52 is removed, and a doped polysilicon layer is deposited on an inner surface of the cylindrical lower electrode 31 by the CVD process, and grown to become hemi-spherical silicon grains 31A, as shown in FIG. 5.

Thus, as shown in FIG. 5, a number of hemi-spherical silicon grains 31A, which are formed of doped polysilicon, are formed on an inner surface of the cylindrical lower electrode 31, and have substantially the same size.

After the hemi-spherical silicon grains 31A are formed, an oxide film etching is conducted for the NSG film 14.

Here, when the lower electrode 31 is formed, the impurity (for example, phosphorus) doped in the polysilicon of the lower electrode 31, is diffused into the NSG film 14 and the BPSG film, so that an outer surface region of the NSG film 14 and the BPSG film has a high concentration of phosphorus. Namely, since the NSG film 14 has a concentration gradient of phosphorus, when the NSG film 14 is etched particularly by a wet etching, a difference occurs in an etch rate within the NSG film 14.

As a result, by this oxide film etching, the NSG film 14 is selectively etched so that a convex upper end 11A is formed on an upper end of the partition 11, as shown in FIG 1. Thus, a semiconductor memory is formed as shown in FIG. 1.

Here, by adjusting the oxide film etching for the partition 11, particularly, the NSG film 14, the upper end 11A of the partition 11 can be sharpened, and the outer surface of the lower electrode is exposed and the gutter 101 can be formed.

It is preferred if the shape of the upper end 11A of the partition 11 is sharpened to prevent the flaked-off hemi-spherical silicon grains 31A from nidating on the upper end 11A. The depth of the gutter 101 is preferred to be about a half of the depth of the cylinder 2.

Thereafter, an acid washing is carried out for the surface formed of the lower electrode 31 and the upper end 11A of the partition 11, and then, a dielectric film formed of an insulating film and an upper electrode (not shown) are formed on the lower electrode 31 in the named order. Thus, the semiconductor memory is formed.

Now, a specific example of the semiconductor memory will be described. However, in the following description, only the formation of the hemi-spherical silicon grains 31A and the oxide film etching to be carried out after the formation of the hemi-spherical silicon grains 31A, are explained.

As shown in FIG. 5, the hemi-spherical silicon grains 31A are formed on the inner surface of the cylinder 2.

The condition for forming the hemi-spherical silicon grains 31A is that 20 minutes were required for forming nucleuses of hemi-spherical silicon grains, and then, an annealing was conducted at 560 degrees Celsius for 50 minutes for graining.

As a result, the size of one single grain of the grown hemi-spherical silicon grains was on the order of 30 nm to 40 nm.

Figure 6:
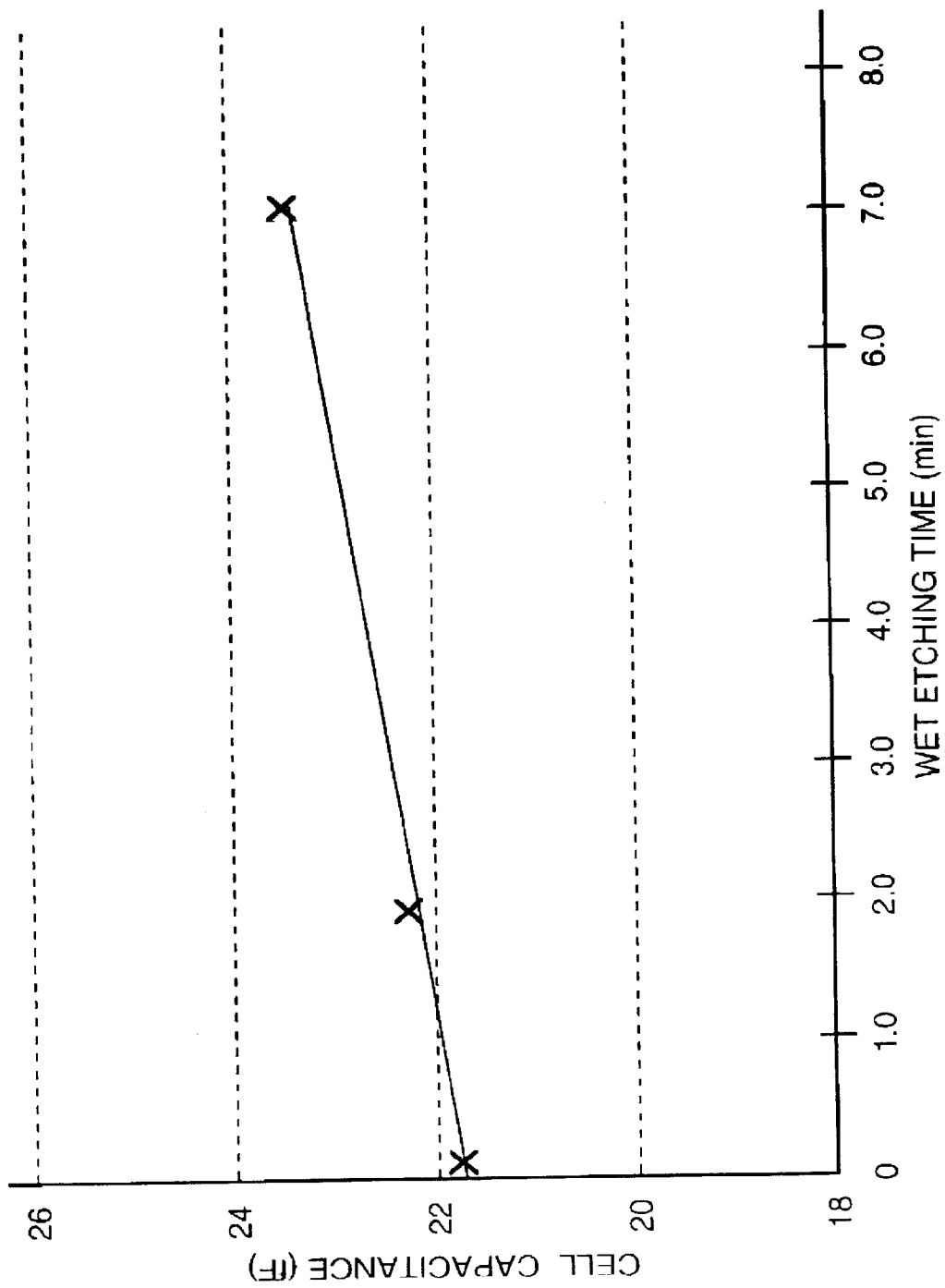
FIG. 6 are a graph illustrating the relation between the wet etching condition and the measured capacitance value of the capacitor formed in the embodiment of the semiconductor memory in accordance with the present invention.

Thereafter, a wet etching was conducted for the NSG film 14 by using a diluted hydrogen fluoride. The result of this wet etching is shown in FIG. 6. FIG. 6 are a graph illustrating the relation between the wet etching condition and the measured capacitance value of the capacitor formed in the embodiment of the semiconductor memory in accordance with the present invention. Here, the capacitor is formed of the lower electrode and the upper electrode (not shown) separated by the dielectric film, to constitute a capacitor portion of the memory cell.

At this time, the etching rate for the NSG film 14 was about 20 nm/min when no phosphorus is diffused into the NSG film 14 and about 35 nm/min when phosphorus is diffused into the NSG film 14.

As shown in FIG. 6, in the prior art semiconductor memory in which no wet etching is carried out, the capacitor of the memory cell has a capacitance on the order of about 22 fF. However, by carrying out the wet etching for a predetermined length of time, the capacitance of the memory cell capacitor increases. By carrying out the wet etching for about four minutes or more, it is possible to fabricate a memory cell which always ensures a capacitance on the order of about 23 fF to 24 fF. This increase of the capacitance is considered to be attributable to the gutter 101.

On the other hand, when the memory cells having the memory cell capacitor of the capacitance on the order of about 22 fF were formed without carrying out the wet etching, the non-defective percentage of the semiconductor memory was 50% to 60%. On the other hand, when the memory cells having the memory cell capacitor of the capacitance on the order of about 23 fF to 24 fF were formed by carrying out the net etching for at least four minutes, the non-defective percentage of the semiconductor memory elevated 80%. This elevation of the non-defective percentage is considered to be attributable to the upper end 11A.

As seen from the above, according to the present invention, it is possible to prevent a short-circuiting between the adjacent lower electrodes, namely, between the adjacent memory cells, without reducing the capacitance of the memory cell.

In addition, by forming the gutter between the partition and the lower electrode, it is possible to cause the gutter to accommodate the hemi-spherical grain silicon flaked off in the acid washing step performed after the formation of the hemi-spherical grain silicon. Therefore, it is possible to prevent the short-circuiting between the adjacent lower electrodes which would otherwise have been caused by the flaked-off hemi-spherical grain silicon nidating on the upper end of the partition. Therefore, reliability of the semiconductor memory is elevated.

In the prior art, since the surface area of the capacitor lower electrode was limited to only an inner surface of the cylinder, it was difficult to increase the memory cell capacitor capacitance. This problem can be overcome by the present invention, since the outer surface of the cylindrical lower electrode is exposed.

Specifically, by forming the upper end of the partition to have a sharpened tip end so that the outer surface of the cylindrical lower electrode becomes exposed, the surface area of the lower electrode is increased. Thus, the capacitance of the memory cell capacitor never becomes lower than a standard value, and therefore, the yield of production of the semiconductor memory can be elevated.

The invention has thus been shown and described with reference to the specific embodiments. However, it should be noted that the present invention is in no way limited to the details of the illustrated structures but changes and modifications may be made within the scope of the appended claims.

What is claimed is:

1. In a semiconductor memory having a plurality of stacked capacitor memory cells each having a cylindrical lower electrode which is in the form of a cylinder having an open top and a closed bottom and which is formed of a doped polysilicon having a predetermined thickness, said cylindrical lower electrode having a hemi-spherical grain silicon formed on an inner surface of said cylindrical lower electrodes, wherein an upper end of a partition, which is formed of an insulating material between adjacent cylindrical lower electrodes, has a non-flat surface that ensures that no silicon grain of said hemi-spherical grain silicon is positioned on the upper end of said partition.

2. A semiconductor memory claimed in claim 1 wherein said upper end of said partition has an inclined surface.

3. A semiconductor memory claimed in claim 1 wherein said upper end of said partition is convex.

4. A semiconductor memory claimed in claim 1 wherein said upper end of said partition has a projecting center portion.

5. A semiconductor memory claimed in claim 1 wherein said partition is continuously formed, and the continuously formed partition has a continuously formed upper end.

6. A semiconductor memory claimed in claim 1 wherein said cylindrical lower electrode has an exposed outer wall surface.

7. A semiconductor memory claimed in claim 1 wherein a gutter is formed between said partition and said cylindrical lower electrode.

8. A semiconductor memory claimed in claim 7 wherein an outer wall surface of said cylindrical lower electrode is exposed in said gutter.

9. A semiconductor memory claimed in claim 7 wherein said gutter has a width larger than the size of one silicon grain of said hemi-spherical grain silicon formed on said inner surface of said cylindrical lower electrode.

10. A semiconductor memory claimed in claim 9 wherein said gutter has a depth not larger than a half of the depth of said partition.

11. A semiconductor memory claimed in claim 4 wherein a gutter is formed between said partition and said cylindrical lower electrode.

12. A semiconductor memory claimed in claim 11 wherein an outer wall surface of said cylindrical lower electrode is exposed in said gutter.

13. A semiconductor memory claimed in claim 11 wherein said gutter has a width larger than the size of one silicon grain of said hemi-spherical grain silicon formed on said inner surface of said cylindrical lower electrode.

14. A semiconductor memory claimed in claim 13 wherein said gutter has a depth not larger than a half of the depth of said partition.

15. A semiconductor memory claimed in claim 3 wherein a gutter is formed between said partition and said cylindrical lower electrode, and an outer wall surface of said cylindrical lower electrode is exposed in said gutter.

16. A semiconductor memory claimed in claim 15 wherein said gutter has a width larger than the size of one silicon grain of said hemi-spherical grain silicon formed on said inner surface of said cylindrical lower electrode.

17. A semiconductor memory claimed in claim 16 wherein said gutter has a depth not larger than a half of the depth of said partition.

* * * * *